(12) United States Patent
Ivanov et al.

(10) Patent No.: US 9,147,505 B2
(45) Date of Patent: Sep. 29, 2015

(54) LARGE AREA CONTROLLED ASSEMBLY OF TRANSPARENT CONDUCTIVE NETWORKS

(75) Inventors: Ilia N. Ivanov, Knoxville, TN (US); John T. Simpson, Clinton, TN (US)

(73) Assignee: UT-BATTELLE, LLC, Oak Ridge, TN (US)

( * ) Notice: Subject to any disclaimer, the term of this patent is extended or adjusted under 35 U.S.C. 154(b) by 932 days.

(21) Appl. No.: 13/287,461

(22) Filed: Nov. 2, 2011

(65) Prior Publication Data

US 2013/0108840 A1     May 2, 2013

(51) Int. Cl.
| | |
|---|---|
| *B32B 3/00* | (2006.01) |
| *B05D 5/12* | (2006.01) |
| *H01B 1/24* | (2006.01) |
| B05D 5/08 | (2006.01) |
| B05D 1/00 | (2006.01) |
| H01L 51/52 | (2006.01) |
| H01L 51/44 | (2006.01) |

(52) U.S. Cl.
CPC .. *H01B 1/24* (2013.01); *B05D 1/00* (2013.01); *B05D 5/08* (2013.01); *H01L 51/442* (2013.01); *H01L 51/5209* (2013.01); *Y10T 428/24802* (2015.01)

(58) Field of Classification Search
CPC ....................................................... B05D 5/12
See application file for complete search history.

(56) References Cited

U.S. PATENT DOCUMENTS

| | | | |
|---|---|---|---|
| 3,890,412 A * | 6/1975 | Boler | ............................. 261/90 |
| 3,953,131 A | 4/1976 | Britz | |
| 4,912,314 A | 3/1990 | Sink | |
| 5,110,334 A | 5/1992 | Ayers | |
| 5,400,136 A | 3/1995 | Vo-Dinh | |
| 5,763,058 A * | 6/1998 | Isen et al. | ....................... 428/209 |
| 5,795,782 A | 8/1998 | Church et al. | |
| 6,015,714 A | 1/2000 | Baldarelli et al. | |
| 6,338,547 B1 | 1/2002 | Silverbrook | |
| 6,362,002 B1 | 3/2002 | Denison et al. | |
| 6,413,792 B1 | 7/2002 | Sauer et al. | |

(Continued)

FOREIGN PATENT DOCUMENTS

| | | |
|---|---|---|
| JP | 2004082663 A2 | 3/2004 |
| JP | 2005139269 A2 | 6/2005 |

(Continued)

OTHER PUBLICATIONS

Aguirre, C., et al., "Carbon Nanotube Sheets as Electrodes in Organic Light Emitting Diodes", Applied Physics Letters, 2006, 88, p. 183104-1-183104-3.

(Continued)

*Primary Examiner* — Mark Ruthkosky
*Assistant Examiner* — Ian Rummel
(74) *Attorney, Agent, or Firm* — Brinks Gilson & Lione

(57) ABSTRACT

A method of preparing a network comprises disposing a solution comprising particulate materials in a solvent onto a superhydrophobic surface comprising a plurality of superhydrophobic features and interfacial areas between the superhydrophobic features. The plurality of superhydrophobic features has a water contact angle of at least about 150°. The method of preparing the network also comprises removing the solvent from the solution of the particulate materials, and forming a network of the particulate materials in the interfacial areas, the particulate materials receding to the interfacial areas as the solvent is removed.

14 Claims, 9 Drawing Sheets

(56) References Cited

U.S. PATENT DOCUMENTS

| | | | |
|---|---|---|---|
| 6,532,326 B1 | 3/2003 | Hutchinson et al. |
| 6,552,842 B2 | 4/2003 | Simpson et al. |
| 6,661,952 B2 | 12/2003 | Simpson et al. |
| 6,673,615 B2 | 1/2004 | Denison et al. |
| 6,757,463 B2 | 6/2004 | Hutchinson et al. |
| 6,853,669 B2 | 2/2005 | Simpson et al. |
| 6,876,394 B1 | 4/2005 | Silverbrook |
| 6,897,015 B2 | 5/2005 | Henderson et al. |
| 6,931,329 B1 | 8/2005 | Good, Jr. et al. |
| 6,998,228 B2 | 2/2006 | Henderson et al. |
| 7,001,792 B2 | 2/2006 | Sauer et al. |
| 7,006,143 B1 | 2/2006 | Silverbrook |
| 7,007,710 B2 | 3/2006 | Heller et al. |
| 7,008,769 B2 | 3/2006 | Henderson et al. |
| 7,042,488 B2 | 5/2006 | Higuchi et al. |
| 7,060,448 B2 | 6/2006 | Henderson et al. |
| 7,102,656 B2 | 9/2006 | Mirkin et al. |
| 7,108,773 B2 | 9/2006 | Masel et al. |
| 7,139,072 B1 | 11/2006 | Boss et al. |
| 7,140,720 B2 | 11/2006 | Silverbrook et al. |
| 7,150,904 B2 | 12/2006 | D'Urso et al. |
| 7,172,682 B2 | 2/2007 | Dordick et al. |
| 7,189,503 B2 | 3/2007 | Akeson et al. |
| 7,238,485 B2 | 7/2007 | Akeson et al. |
| 7,256,824 B2 | 8/2007 | Silverbrook |
| 7,258,418 B2 | 8/2007 | Silverbrook |
| 7,258,731 B2 | 8/2007 | D'Urso et al. |
| 7,267,948 B2 | 9/2007 | Vo-Dinh |
| 7,268,662 B2 | 9/2007 | Hines et al. |
| 7,310,544 B2 | 12/2007 | Brister et al. |
| 7,312,088 B2 | 12/2007 | Farquharson |
| 7,312,875 B2 | 12/2007 | Hanson et al. |
| 7,344,832 B2 | 3/2008 | Henderson et al. |
| 7,350,887 B2 | 4/2008 | Silverbrook |
| 7,351,588 B2 | 4/2008 | Poponin |
| 7,358,291 B2 | 4/2008 | Curran et al. |
| 7,360,850 B2 | 4/2008 | Silverbrook |
| 7,373,083 B2 | 5/2008 | Silverbrook et al. |
| 7,385,639 B2 | 6/2008 | Silverbrook |
| 7,391,018 B2 | 6/2008 | Niu et al. |
| 7,404,617 B2 | 7/2008 | Silverbrook |
| 7,432,371 B2 | 10/2008 | Kriesel et al. |
| 7,439,731 B2 | 10/2008 | Crafts et al. |
| 7,466,341 B2 | 12/2008 | Silverbrook |
| 7,477,287 B2 | 1/2009 | Silverbrook |
| 7,494,465 B2 | 2/2009 | Brister et al. |
| 7,497,827 B2 | 3/2009 | Brister et al. |
| 7,524,018 B2 | 4/2009 | Silverbrook |
| 7,568,775 B2 | 8/2009 | Silverbrook |
| 7,568,794 B2 | 8/2009 | Silverbrook |
| 7,576,794 B2 | 8/2009 | Silverbrook |
| 7,588,329 B2 | 9/2009 | Silverbrook |
| 7,593,058 B2 | 9/2009 | Silverbrook |
| 7,604,323 B2 | 10/2009 | Silverbrook et al. |
| 7,767,564 B2 | 8/2010 | Dutta |
| 2002/0121856 A1 | 9/2002 | Tsai |
| 2005/0099461 A1 | 5/2005 | Silverbrook et al. |
| 2005/0109918 A1 | 5/2005 | Nikzad et al. |
| 2005/0146552 A1 | 7/2005 | Silverbrook |
| 2005/0174432 A1 | 8/2005 | Silverbrook |
| 2005/0179722 A1 | 8/2005 | Silverbrook |
| 2005/0196775 A1 | 9/2005 | Swager et al. |
| 2005/0264157 A1 | 12/2005 | Sakai et al. |
| 2005/0268962 A1 | 12/2005 | Gaudiana et al. |
| 2006/0017917 A1 | 1/2006 | Cullum et al. |
| 2006/0023019 A1 | 2/2006 | Silverbrook |
| 2006/0023451 A1 | 2/2006 | Han et al. |
| 2006/0034729 A1 | 2/2006 | Poponin |
| 2006/0110437 A1 | 5/2006 | Stupp et al. |
| 2006/0252065 A1 | 11/2006 | Zhao et al. |
| 2006/0289380 A1 | 12/2006 | D'Urso et al. |
| 2007/0034598 A1 | 2/2007 | Silverbrook et al. |
| 2007/0048249 A1 | 3/2007 | Youngblood et al. |
| 2007/0131266 A1 | 6/2007 | Dutta |
| 2007/0155021 A1 | 7/2007 | Zhang et al. |
| 2007/0164270 A1 | 7/2007 | Majumdar et al. |
| 2007/0178280 A1* | 8/2007 | Bower et al. ............ 428/141 |
| 2007/0200891 A1 | 8/2007 | Silverbrook |
| 2007/0209943 A1 | 9/2007 | Bureau |
| 2008/0026188 A1 | 1/2008 | D'Urso et al. |
| 2008/0061689 A1 | 3/2008 | Ohkubo et al. |
| 2008/0080816 A1 | 4/2008 | D'Urso et al. |
| 2008/0111873 A1 | 5/2008 | Silverbrook |
| 2008/0144026 A1 | 6/2008 | Zhao et al. |
| 2008/0160865 A1 | 7/2008 | Wei et al. |
| 2008/0169016 A1 | 7/2008 | Dutta |
| 2008/0191606 A1 | 8/2008 | Geohegan et al. |
| 2008/0198376 A1 | 8/2008 | Poponin |
| 2008/0296252 A1 | 12/2008 | D'Urso et al. |
| 2008/0306202 A1 | 12/2008 | Lin et al. |
| 2009/0042469 A1 | 2/2009 | Simpson |
| 2009/0096834 A1 | 4/2009 | Silverbrook et al. |
| 2009/0123185 A1 | 5/2009 | Lin et al. |
| 2010/0021745 A1 | 1/2010 | Simpson et al. |
| 2010/0107285 A1 | 4/2010 | Ekinci et al. |
| 2011/0061478 A1 | 3/2011 | Ivanov et al. |
| 2011/0062410 A1 | 3/2011 | Ivanov et al. |
| 2011/0063610 A1 | 3/2011 | Ivanov et al. |

FOREIGN PATENT DOCUMENTS

| | | |
|---|---|---|
| KR | 20040104837 | 8/2005 |
| WO | WO 2004/046167 A2 | 6/2004 |
| WO | WO 2004/046167 A3 | 6/2004 |
| WO | WO 2008/047324 A2 | 4/2008 |
| WO | WO 2008/047324 A3 | 4/2008 |
| WO | WO 2009/020261 A1 | 2/2009 |

OTHER PUBLICATIONS

Artukovic, E., et al., "*Transparent and Flexible Carbon Nanotube Transistors*", Nano Letters, 2005, 5(4): p. 757-760.

Bertoni, C., et al., "*Layer-by-Layer Deposition of Ultra-Thin Films of Carbon Nanotubes*", Physica E. 2008, 40: p. 2257-2262.

Bezryadin, A., et al., "*Multiprobe Transport Experiments on Individual Single-Wall Carbon Nanotubes*", Physical Review Letters, 1998, 80(18): p. 4036-4039.

Buldum, A., et al., "*Contact Resistance Between Carbon Nanotubes*", Physical Review B, 2001, 63(16): p. 161403-1-161403-4.

Bune, Andris V. et al., "*Numerical Modeling of HgCdTe Solidification: Effects of Phase Diagram, Double-Diffusion Convection and Microgravity Level*" SPIE—The International society for Optical Engineering, vol. 3123, 1997, 12 pages.

Castro, M.R.S., et al., "*Preparation and Characterization of Low- and High-Adherent Transparent Multi-Walled Carbon Nanotube Thin Films*", Materials Chemistry and Physics, 2008, 111: p. 317-321.

Dorn, Reinhold J. et al., "*Design of the Crires 512 X4096 Pixels Aladdin inSb Focal Plane Array Detector Mosaic*", European Southern Observatory, 4 pages.

Du, Fangming, et al., "*Effect of Nanotube Alignment on Percolation Conductivity in Carbon Nanotube/Polymer Composites*", Physical Review B 72, 121404(R) (2005).

Du Pasquier, A.U., et al.,"*Conducting and Transparent Single-Wall Carbon Nanotube Electrodes for Polymer-Fullerene Solar Cells*", Applied Physics Letters, 2005, 87: p. 203511-1-203511-3.

Geng, Hong-Zhang, et al., "*Effect of Acid Treatment on Carbon Nanotube-Based Flexible Transparent Conducting Films*", Journal of the American Chemical Society, 2007, 129, p. 7758-7759.

Gibbons, D.F., "*Thermal Expansion of Some Crystals With the Diamond Structure*", Physical Review, vol. 112, No. 1, Oct. 1, 1958, pp. 136-140.

Goldberg, Yu A. et al., "*Handbook Series on Semiconductor Parameters,*"vol. 1, World Scientific, London, 1996, pp. 191-213.

Gordon, R., "*Criteria for Choosing Transparent Conductors*", MRS Bulletin, 2000, 25(8): p. 52-57.

Green, A. et al., "*Colored Semitransparent Conductive Coatings Consisting of Monodisperse Metallic Single-Walled Carbon Nanotubes*", Nano Letters, 2008, 8: p. 1417-1422.

(56) References Cited

OTHER PUBLICATIONS

Gruner, G., "Carbon Nanotube Films for Transparent and Plastic Electronics," Journal of Materials Chemistry, 2006, 16: p. 3533-3539.
Hennrich, Frank, et al., "Preparation, Characterization and Applications of Free-Standing Single Walled Carbon Nanotube Thin Films", Physical Chemistry Chemical Physics, 2002: p. 2273-2277.
Hu, L., et al., "Percolation in Transparent and Conducting Carbon Nanotube Networks", Nano Letters, 2004, 4: p. 2513-2517.
Huang, Limin, et al., "Self-Organizing High-Density Single-Walled Carbon Nanotube Arrays From Surfactant Suspensions", Nanotechnology, 2004, 15: p. 1450-1454.
Kong, J., et al., "Synthesis, Integration, and Electrical Properties of Individual Single-Walled Carbon Nanotubes", Applied Physics A, 1999, 69: p. 305-308.
Lee, K., et al., "Single Wall Carbon Nanotubes for P-Type Ohmic Contacts to GaN Light-Emitting Diodes", Nano Letters, 2004, 4(5): p. 911-914.
Li, Zhongrui, et al., "Does the Wall Number of Carbon Nanotubes Matter as Conductive Transparent Material", applied Physics Letters, 2007, 91: p. 03115.
Ng, M.H. Andrews, et al., "Efficient Coating of Transparent and Conductive Carbon Nanotube Thin Films on Plastic Substrates", Nanotechnology, 2008, 19: p. 205703.
Popov, Yuri O., "Evaporative Deposition Patterns: Spatial Dimensions of the Deposit" Phys. Rev. E, 71 036313 (2005).
Rogalski, A., "HgCdTe Infrared Detector Material: History, Status and Outlook", Institute of Physics Publishing, Reports on Progress in Physics, vol. 68, 2005, pp. 2267-2336.
Rowell, Michael W., et al., "Organic Solar Cells With Carbon Nanotube Network Electrodes", Applied Physics Letters, 2006, 88: p. 233506-1-233506-3.
Shen, Xiaoying, et al., "Minimal Size of Coffee Ring Structure", J. Phys. Chem. B 2010, 114, pp. 5269-5274.
Unalan, Husnu Emrah, et al., "Design Criteria for Transparent Single-Wall Carbon Nanotube Thin-Film Transistors", Nano Letters, 2006, 6:, p. 677-682.
Wang, Yue et al., "A Two-Stage Technique for Single Crystal Growth of HgCdTe Using a Pressurized Bridgman Method", Journal of Crystal Growth, vol. 263, Issues 1-4, Mar. 1, 2004, pp. 273-282.
Wang, Yue et al., "Growth and Properties of 40 mm Diameter Hg1-xCdxTe Using the Two-Stage Pressurized Bridgman Method", Journal of Crystal Growth, vol. 273, Issues 1-2, Dec. 17, 2004, pp. 54-62.
Williams, Quinton L., et al., "Boron-Doped Carbon Nanotube Coating for Transparent, Conducting, Flexible Photonic Devices", Applied Physics Letters, 2007, 91: p. 143116.
Wu, Zhuangchun, et al., "Transparent, Conductive Carbon Nanotube Films", Science, 2004, 305: p. 1273-1276.
Xu, Zhihua et al., "Carbon Nanotube Effects on Electroluminescence and Photovoltaic Response in Conjugated Polymers", Applied Physics Letters 87, 263118 (2005), 3 pgs.
Zhang, Xuejun et al., "Mass-Productions of Vertically Aligned Extremely Long Metallic Micro/Nanowires Using Fiber Drawing Nanomanufacturing", Advanced Materials, 2008, pp. 105.
Zhou, Chongwu, et al., "Electrical Measurements of Individual Semiconducting Single-Walled Carbon nanotubes of Various Diameters", Applied Physics Letters, 2000, 76(12): p. 1597-1599.
Ma, Minglin, et al., "Superhydrophobic Surfaces", Current Opinion in Colloid & Interface Science, 11, (2006), pp. 193-202.
Roach, Paul, et al., "Progess in Superhydrophobic Surface Development," Soft Matter, 2008, vol. 4, pp. 224-240.
Shirtcliffe et al., "An Introduction to Superhydrophobicity", Advances in Colloid and Interface Science, 161, (2010), pp. 124-138.
Vakarelski, Ivan U., et al., "Assembly of Gold Nanoparticles into Microwire Networks Induced by Drying Liquid Bridges", Phys. Rev. Lett. 102, (2009), p. 058303.
Yoon, Tae Oh, et al., "Formation of Superhydrophobic Poly(Dimethysiloxane) by Ultrafast Laser-Induced Surface Modification," Optics Express, vol. 16, No. 17, Aug. 2008.

* cited by examiner

Fig. 8
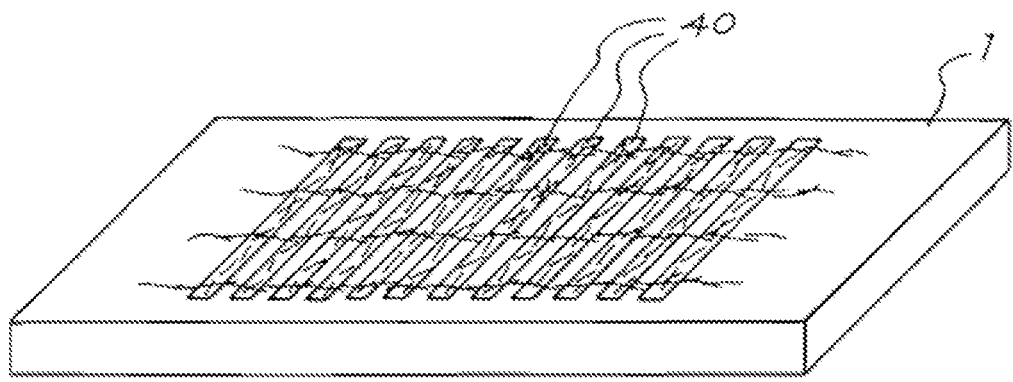
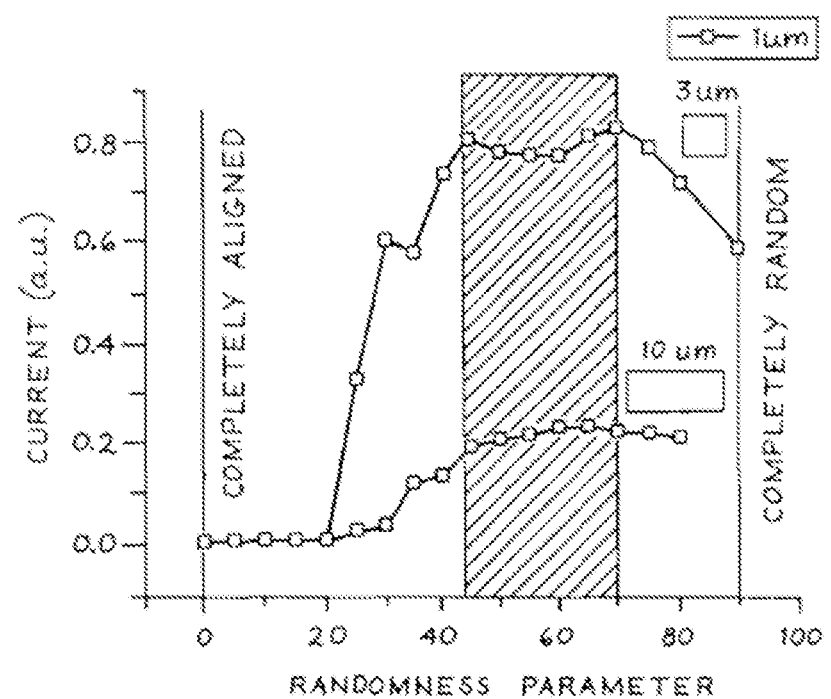
Fig. 11

LARGE AREA CONTROLLED ASSEMBLY OF TRANSPARENT CONDUCTIVE NETWORKS

The United States Government has rights in this invention pursuant to contract No. DE-AC05-00OR22725 between the United States Department of Energy and UT-Battelle, LLC.

FIELD

The present disclosure relates to a method of preparing large area controlled assembly of transparent conductive networks, and large area controlled assemblies of transparent conductive networks.

BACKGROUND

Transparent conductive coatings may be made from both organic and inorganic materials, such as metal oxides. Transparent conductive coatings have many applications, such as in fabrication of solar and organic light emitting arrays, flexible electrodes, touch screen monitors, flat panel displays, and so on. Some technologies may be used to prepare patterned transparent conductive structures. These technologies usually involve complex multi-step processes, such as forming a mask on a substrate before any transparent conductive materials are deposited to the substrate, and removing the mask after the deposition.

BRIEF SUMMARY

A method of preparing a network comprises disposing a solution comprising particulate materials in a solvent onto a superhydrophobic surface comprising a plurality of superhydrophobic features and interfacial areas between the superhydrophobic features. The plurality of superhydrophobic features has a water contact angle of at least about 150°. The method of preparing the network also comprises removing the solvent from the solution of the particulate materials, and forming a network of the particulate materials in the interfacial areas, the particulate materials receding to the interfacial areas as the solvent is removed.

A device comprises a plurality of superhydrophobic features and interfacial areas between the superhydrophobic features. The plurality of superhydrophobic features having a water contact angle of at least about 150°. The device also comprises a conductive network of particulate nanomaterials disposed on the interfacial areas and divided by the superhydrophobic features. The conductive network comprises a plurality of conductive lines of the particulate nanomaterials formed in the interfacial area between two adjacent superhydrophobic features.

BRIEF DESCRIPTION OF THE DRAWINGS

FIG. 8 is an illustration of the micro- or nano-size conductive network prepared according to one embodiment of the present disclosure.

FIG. 11 illustrates a computer modeling showing the effect of nanotube alignment on the percolation between the source and drain electrodes.

DETAILED DESCRIPTION OF THE PREFERRED EMBODIMENTS

A method for assembling conductive particulate materials such as micro- or nano-size tubes, wires, rods and particles into micro- and nano-size networks such as conductive coatings is provided. The micro- and nano-size networks may be transparent conductive structures. For example, a patterned superhydrophobic substrate may be prepared and used as a guide to assemble micro- or nano-size particulate nanomaterials, such as nanotubes, nanowires, nanorods and nanoparticles, from a solution, which are dried to form a transparent conductive structure.

Figure 1A:
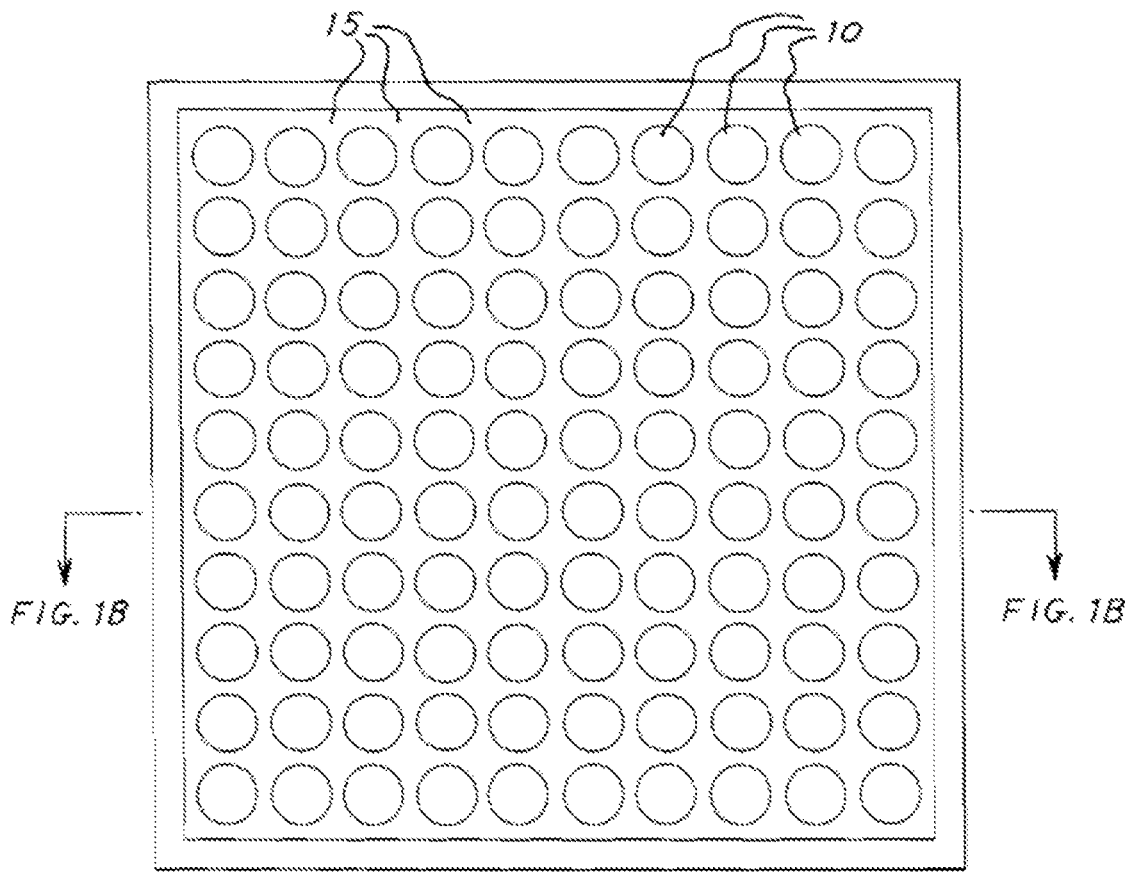
FIG. 1 is an illustration of a method of preparing large area controlled assembly of transparent conductive networks according to a first embodiment of the present disclosure.
Figure 1B:
Figure 2A:
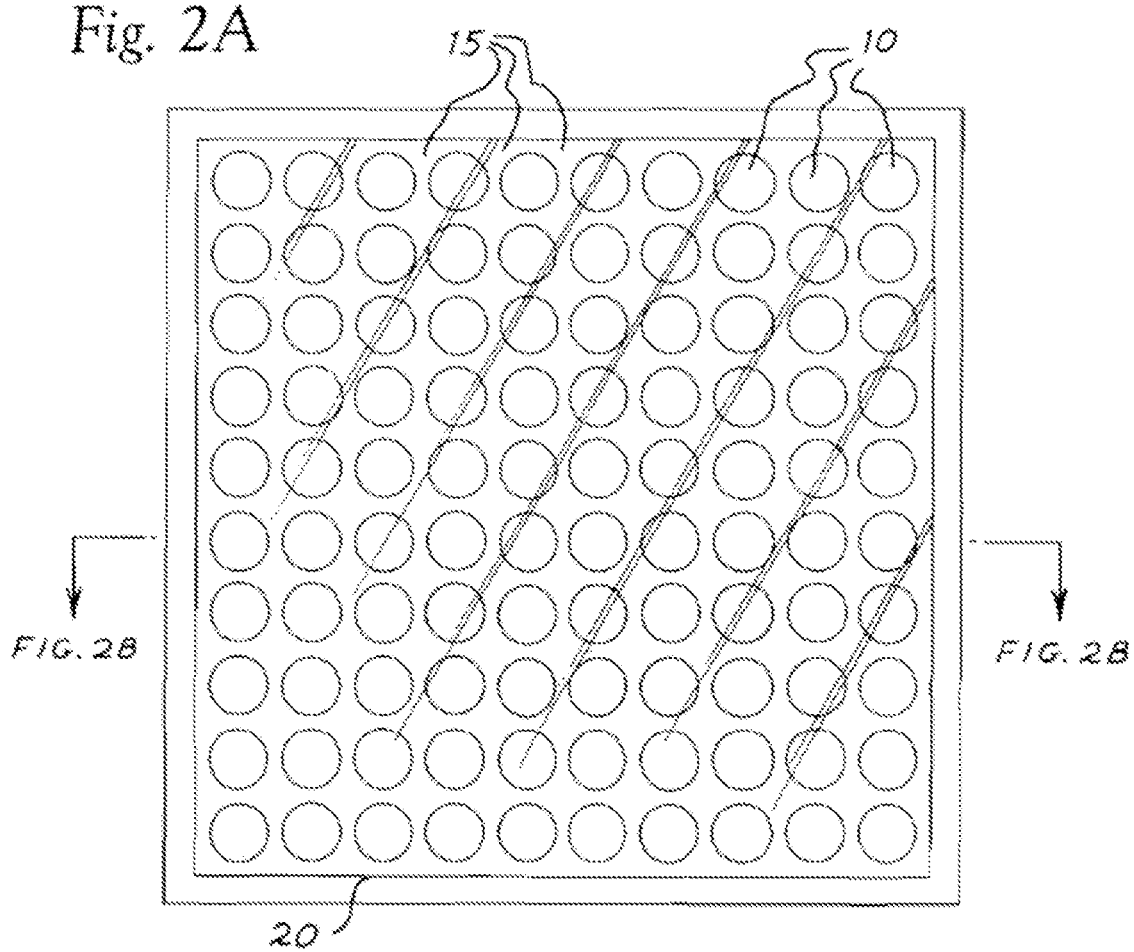
FIG. 2 is an illustration of a method of preparing large area controlled assembly of transparent conductive networks according to a second embodiment of the present disclosure.
Figure 2B:
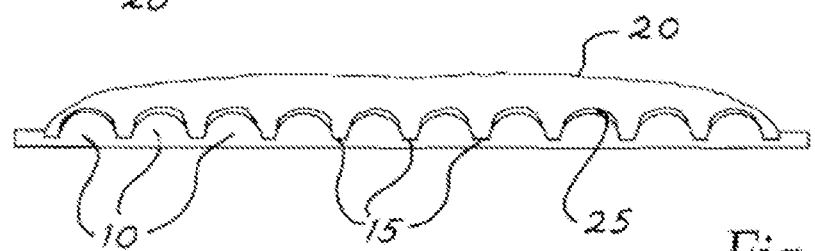
Figure 4:
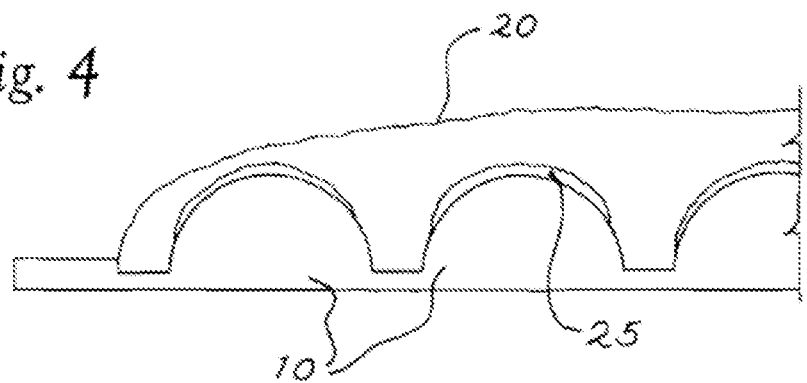
FIG. 4 is an illustration of the interface between the nanomaterial solution and the superhydrophobic surface according to one embodiment of the present disclosure.

According to a first embodiment, as shown in FIG. 1, a superhydrophobic surface solution is printed to a substrate to form a pattern of superhydrophobic features 10, and the remaining interfacial area 15. The substrate may be flexible. In FIG. 2, according to a second embodiment, a solution of particulate nanomaterials 20, such as an aqueous suspension of nanotubes, nanowires, nanorods or metal nanoparticles, is disposed onto the substrate with the pattern of superhydrophobic features 10. The nanomaterials may be in the form of a suspension of metal nanoparticles, such as gold, silver, zinc, titanium, or combinations thereof, either in the form of an element or ion. Alternatively, the nanomaterials may be in the form of a suspension of metal oxide nanoparticles, such as gold indium oxide, silver oxide, zinc oxide, titanium oxide, tin oxide, zinc oxide, and the like. Other conductive nanomaterials can be used to form the micro- or nano-size conductive network. Generally speaking, the term "nanomaterials" as used herein in refers to particulate materials in the nano- or microscale size range, as defined below. The particulate materials may have any of a variety of morphologies and aspect ratios. For example, nanoparticles, nanowires, carbon nanotubes, nanorods, and particulate forms of semi-metals like carbon (and others) and conducting polymers (for example, poly-3 hexylthiophene and the like) may be employed. Preferably, the nanoparticles, nanowires, carbon nanotubes, and nanorods have aspect ratio (ratio of the diameter to the length).

In one example, the aspect ratio of the nanomaterials may be between about 1 and 2,500. In another example, the aspect ratio of the nanomaterials may be between about 1 and 1,000. In yet another example, the aspect ratio of the nanomaterials may be less than about 100.

Figure 3A:
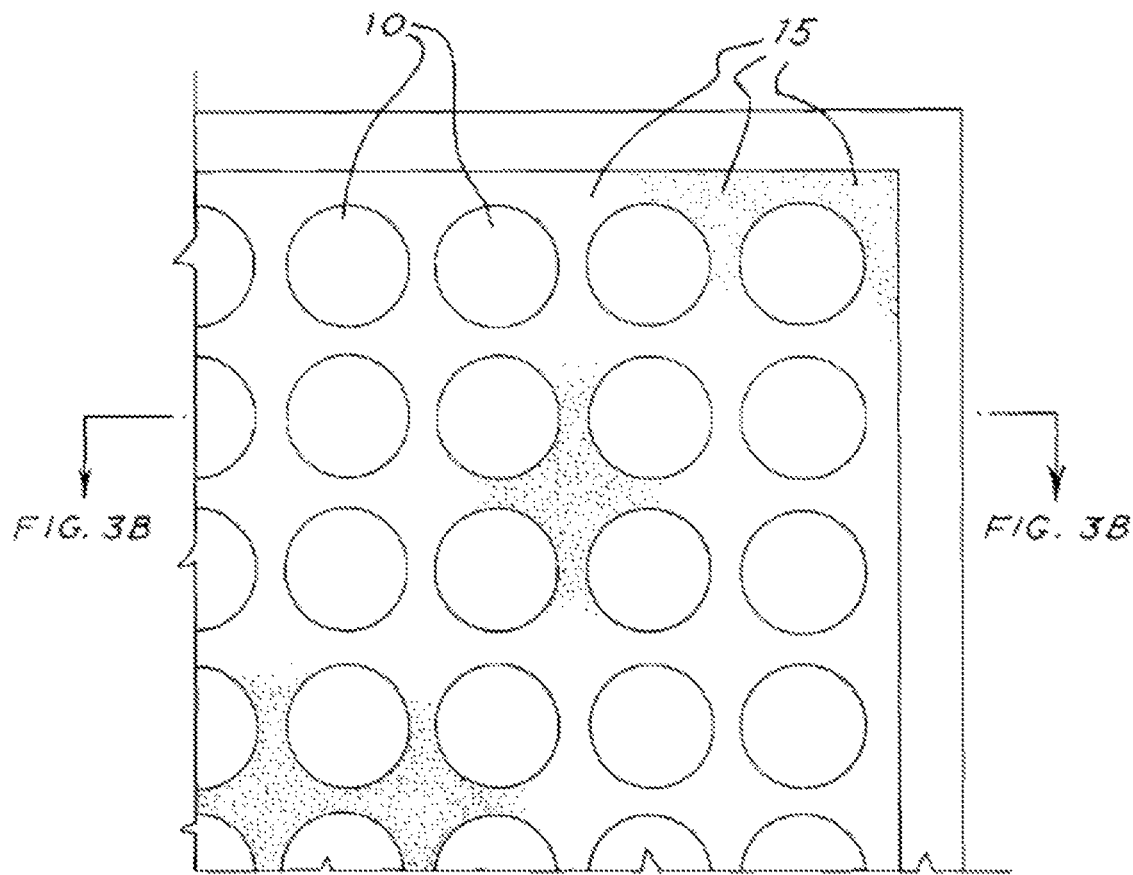
FIG. 3 is an illustration of a method of preparing large area controlled assembly of transparent conductive networks according to a third embodiment of the present disclosure.
Figure 3B:
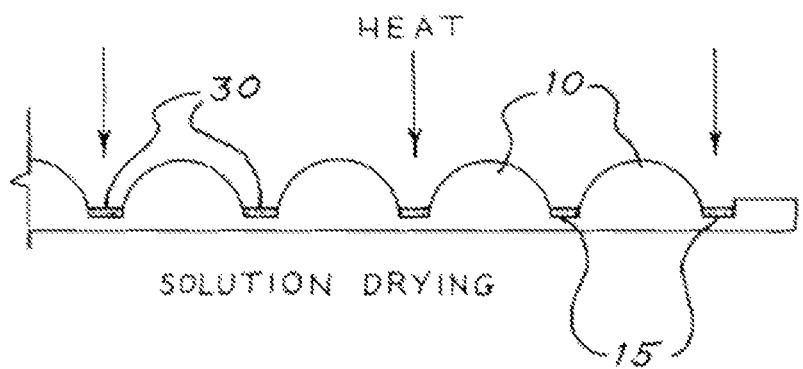

The solution may be added directly to the patterned substrate. According to a third embodiment, as shown in FIG. 3, the solution of nanomaterials 20 is allowed to dry to form a micro- or nano-size network of nanomaterials 30. The concentration of the nanomaterials, the drying temperature, and drying humidity may vary. In one example, the concentration of the nanomaterials is about 2 wt % to 6 wt % in the nanomaterial suspension. In another example, the drying temperature is between 4° C. to 25° C. with a humidity of 60% to 80%. A surfactant may optionally be used in the nanomaterial solution. The surfactant may increase the evaporation stability of the nanoparticle solution and may also help the solution get into the interfacial area 15.

In FIGS. 1-4, when the nanomaterial solution is disposed onto the surface with superhydrophobic features, the solution initially covers both the superhydrophobic features 10, and the interfacial area 15 on the substrate. As the liquid in the nanoparticle solution evaporates in the drying step, the solution disposed on the superhydrophobic features 10 recedes to the interfacial area 15. This receding nanomaterial solution forms the network on the interfacial area 15 when the solution is dried. A plurality of lines of the nanomaterials may form in the interfacial area between two adjacent superhydrophobic features, as discussed in detail infra.

When the nanomaterial solution is disposed onto the surface with superhydrophobic features, air 25 may be trapped between the protrusive features. As a result, at least some of the nanomaterial solution remains suspended above the superhydrophobic features 10 by the trapped air 25. The trapped air 25 may help facilitate slow evaporation.

The superhydrophobic features preferably are patterned. The superhydrophobic patterns may include a combination of features of various sizes. In one example, the superhydrophobic patterns comprises micron or larger size features combined with nano-size features (nanometer or larger but not larger than micron) on the same surface. The superhydrophobic patterns may be created on a substrate surface either mechanically or via patterned etching, such as chemical etching or laser etching.

For example, superhydrophobic patterns can be painted on the surface of a substrate of an arbitrary shape using a superhydrophobic paint, which comprises an adhesive combined with superhydrophobic powders. The adhesive acts as a binder between the powders. Fluorinated adhesives may also provide fluorinated coating upon evaporation of the solvent in the superhydrophobic paint. Superhydrophobic coating may include fluorinated or other superhydrophobic coatings made of various water-repellant powders and additives. Examples of such water-repellant powders include silica, diatoms, diatomaceous earth, spinodally decomposed and differentially etched borosilicate glasses, with or without fluorinated coating, and perfluorinated trichlorosilane. US Patent Publication No. 2010/0021745 to Simpson et al, entitled "Superhydrophobic Diatomaceous Earth", discloses various examples of superhydrophobic materials, the entirety of which is incorporated by reference herein.

Patterning of the superhydrophobic features helps control the transparency of the resultant network. Patterning also helps achieve optimal alignment of nanomaterials in the conductive patterns. Examples of conductive patterns include honeycomb, kagome, triangle, and diamond.

In another embodiment, a method of preparing a network comprises disposing a solution comprising materials in a solvent onto a superhydrophobic surface comprising a plurality of superhydrophobic features and interfacial areas between the superhydrophobic features. The plurality of superhydrophobic features has a water contact angle of at least about 150°. The method of preparing the network also comprises removing the solvent from the solution of the materials, and forming a network of the materials in the interfacial areas, the materials receding to the interfacial areas as the solvent is removed.

A superhydrophobic surface may be a surface, such as a substrate or a film, which has a water contact angle of at least about 150°. The surface may have a water contact angle of at least about 155°, more preferably at least about 160°, even more preferably at least about 165°, still more preferably at least about 170°.

The network may be transparent. Transparent may refer to transparent or translucent. A transparent network may have a percent transmittance of light at 550 nm of about 50%, preferably about 60%, more preferably about 70%, even more preferably about 80%, still more preferably about 90%, further still more preferably about 100%.

The network is preferably conductive. Preferably, the network is a transparent conductive coating. Preferably, nanomaterials are used to prepare the conductive coating. Various nanomaterials can be used to create the superhydrophobic non-conductive areas, for example, the interfacial area 15 as shown in FIGS. 1-4, and/or to create the conductive coatings.

Nanomaterials, preferably in a solution, such as a suspension of nanomaterials, are then sprayed, brushed, deposed, or otherwise disposed onto the superhydrophobic surface. Optionally, a surfactant may be used in the nanomaterial suspension. Subsequent drying (such as controlled heating) evaporates the solvent(s) such that the nanomaterials form micro- or nano-size networks in the non-superhydrophobic area or the recessive area of the surface. Preferably, the nanomaterials are conductive, such as nanotubes, nanowires, nanorods and metal nanoparticles, more preferably gold nanoparticles. Another preferred nanomaterial is carbon nanotubes. Preferably, the superhydrophobic surface includes patterned superhydrophobic features such that the formed micro- or nano-size networks have corresponding reverse patterns. Preferably, the formed micro- or nano-size networks are transparent. More preferably, the formed micro- or nano-size networks are patterned transparent conductive networks.

The solvent from the solution of nanomaterials may be removed by drying the solution. The drying temperature may vary. The drying temperature may depend on the type of solvent applied. For example, the solution may be dried either at room temperature or at an elevated temperature. In some applications, the drying temperature may be lower than the boiling point of the solvent. In one example, a low drying temperature, and thus low evaporation rate, is used in order to facilitate the formation of the micro- or nano-size networks because of the need to prevent the "coffee ring" effect where insoluble particles in a suspension tend to accumulate at the retreating three-phase contact line. In another example, the alignment and deposition of nanomaterials via evaporative deposition may be utilized to prepare aligned micro- and nano-size network, as discussed in detail infra. An elevated drying temperature may be used if speed in fabricating the networks is desired. Too high a drying temperature however may cause bubble formation and results in defects in the networks. For example, when water is the solvent, the drying may be conducted at any temperature between about 0-100° C., such as at about 0° C., 5° C., 10° C., 15° C., 20° C., 25° C., 30° C., 35° C., 40° C., 45° C., 50° C., 55° C., 60° C., 65° C., 70° C., 75° C., 80° C., 85° C., 90° C., 95° C., or 100° C. In one example, when water is the solvent, the slow evaporation rate at 4° C. allows the gold nanoparticles sufficient time to diffuse into the interfacial areas of the superhydrophobic surface while a high evaporation rate at 90° C. results in "coffee ring" patterns.

The shape, size, and periodicity of the prepared networks may vary, depending on the method used to prepare the network and/or the particular application the network will be used. In one example, the size of the superhydrophobic features prepared by many patterning technologies, such as lithography methods, may be down to the lower micrometer range or the nanometer range. In one example, the size of the superhydrophobic features may be between about 100 nm and 100 μm. In another example, the size is between about 100 nm and 1,000 nm. The superhydrophobic features may assume various patterns. For example, the superhydrophobic features with the shape of protruding towers, indented square posts, diced silicon wafer, protruding nano-towers, protruding islands, and metal nanowires have been prepared.

In another example, when the superhydrophobic surface is prepared by glass drawing technology, the superhydrophobic surface may have various periodicities and shapes. The periodicity of the surface may be determined by the periodicity of the bundled tubes before cutting. For example, the bundled drawn glass tubes may be a circle, a square, a rectangle, an oval, a triangle, a hexagonal shape, or any pre-determined cross-sectional shape. The shape of the protrusive features on the surface may vary. For example, the various etching systems, etching time, and differential etchability of the core and matrix material of the glass rod, may each affect the shape of the formed surface features. The superhydrophobic surface may comprise tubes with protrusive features such as spikes, recesses, and cones, hollow tubes, or filled tubes. These tubes may be in nanoscale in diameter, and thus may be referred to as "nanotubes". These protrusive features may have a pre-determined periodicity. The structured substrates may be super-hydrophobic.

In yet another example, some superhydrophobic surfaces may include superhydrophobic features, such as protrusive features, thereon. The shape, size, and periodicity of the prepared networks may be influenced by the superhydrophobic features and interfacial areas of the superhydrophobic surface on which the network is prepared. The superhydrophobic features may be patterned. A superhydrophobic surface may include patterned protrusive superhydrophobic surface features (peaks), and remaining recessive areas (valleys). Alternatively, the superhydrophobic surface may be processed to form superhydrophobic features thereon. The superhydrophobic features may be patterned. For example, a superhydrophobic surface may be etched or scratched to form superhydrophobic surface features and etched or scratched features adjacent to the superhydrophobic surface features.

In one example, a non-superhydrophobic surface is prepared first and then treated to become superhydrophobic by using various methods. Examples of treating methods are described below.

Various methods may be used to prepare superhydrophobic surfaces. For example, superhydrophobic surfaces may be prepared by methods, such as mechanical stretching, laser etching, plasma etching, chemical etching, printing with a superhydrophobic solution, lithography (such as photolithography, electron beam lithography, X-ray lithography, soft lithography, nanosphere lithography and so on), sol-gel processing, solution casting, layer-by-layer and colloidal assembling, electrical/chemical reaction and deposition, electrospinning, and chemical or physical vapor deposition. See, for example, Shirtcliffe et al. "An Introduction to Superhydrophobicity", Advances in Colloid and Interface Science, 161, 124-138 (2010), the entirety of which is incorporated herein by reference. The superhydrophobic surfaces are preferably patterned.

Another method to prepare superhydrophobic surfaces is by using the glass drawing technology, as described in U.S. Pub. No. 2006/0289380, U.S. Pub. No. 2008/0080816, U.S. Ser. Nos. 12/558,101, 12/558,129, and 12/558,145, the entireties of all of which are hereby incorporated by reference. Briefly, a bundle of tubes is formed from a plurality of single tubes, such as glass tubes. The bundle of tubes is drawn, and redrawn if needed, to form a plurality of drawn glass micro or nanotubes. The drawn glass micro or nanotubes are cut, shaped, and coated to form a patterned superhydrophobic surface. The drawn glass superhydrophobic surface may have any shape, such as plates, tiles, or disks.

Various materials may be used to prepare superhydrophobic surfaces. For example, a low surface energy material may be roughened to form superhydrophobic surfaces. In one example, fluorinated polymers, such as poly(tetrafluoroethylene) (Teflon) films, may be roughened to form superhydrophobic surfaces directly. The roughening process may include stretching the Teflon film to achieve a superhydrophobic film. In another example, silicones, such as polydimethylsiloxane (PDMS), may be made into superhydrophobic surfaces using various methods, such as laser etching, nanocasting, and so on. In yet another example, organic materials, such as polyethylene, polystyrene, polyamide, poly(alkylpyrrole), polycarbonate, and alkyl ketone dimer, and inorganic materials, such as ZnO, $TiO_2$, and indium tin oxide (ITO), may be roughened to form superhydrophobic surfaces.

Various methods may be used to render a regular surface superhydrophobic. For example, the surfaces may be modified by covalent or physical binding, adsorption, spraying, printing, or coating. In one example, the non-superhydrophobic surface is coated or coupled with a superhydrophobic group. Suitable superhydrophobic groups include, but are not limited to, a fluorinated groups, hydrophobic siloxanes, and alkyl groups. In one example, the superhydrophobic group is a fluorinated group. The fluorinated group may be either perfluorinated or partially fluorinated. Suitable fluorinated groups include, but are not limited to, perfluorinated alkyl and partially fluorinated alkyl. Suitable alkyl groups include, but are not limited to, hydrocarbon groups that may be linear, cyclic, or branched or a combination thereof. Alkyl groups may be substituted or non-substituted, unless otherwise indicated. Preferably, the superhydrophobic group is fluorinated or a siloxane. Some of the superhydrophobic surface preparation methods are described in Ma et al., Superhydrophobic Surfaces, Current Opinion in Colloid & Interface Science, 11, 2006, 193-202, the entirety of which and the references cited therein are incorporated by reference herein.

Figure 5:
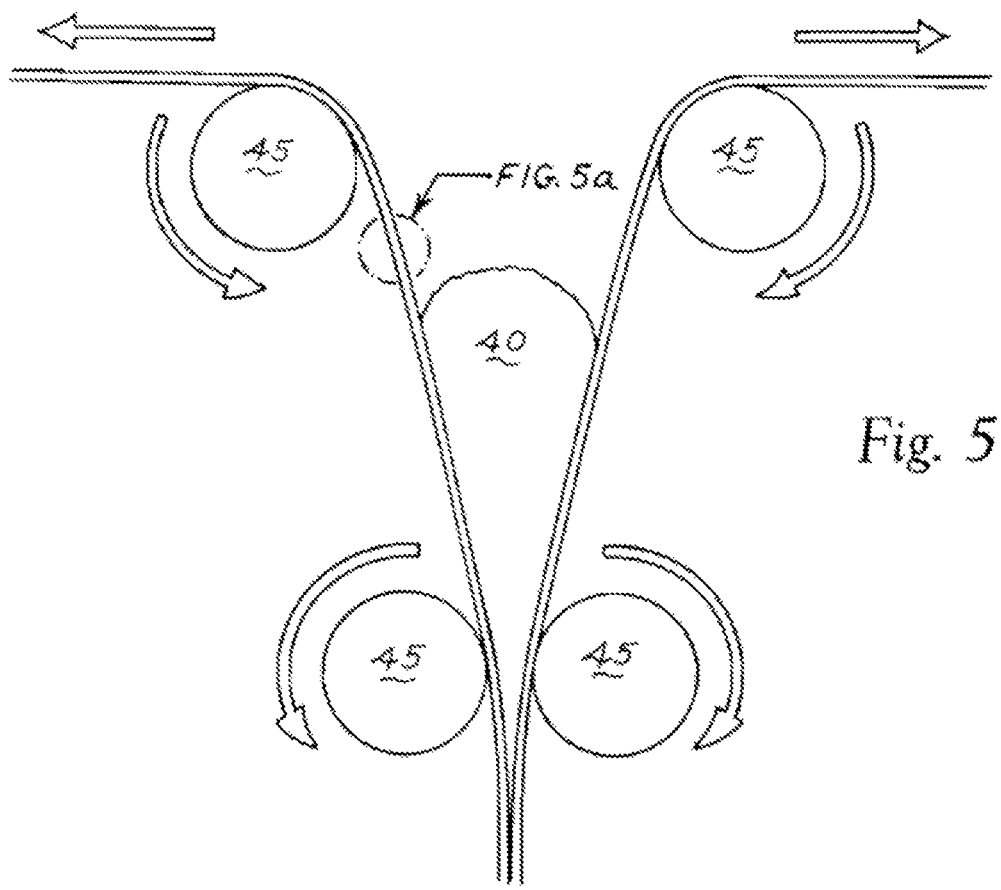
FIG. 5 is an illustration of a method of preparing large area controlled assembly of transparent conductive networks according to another embodiment of the present disclosure.
Figure 5A:
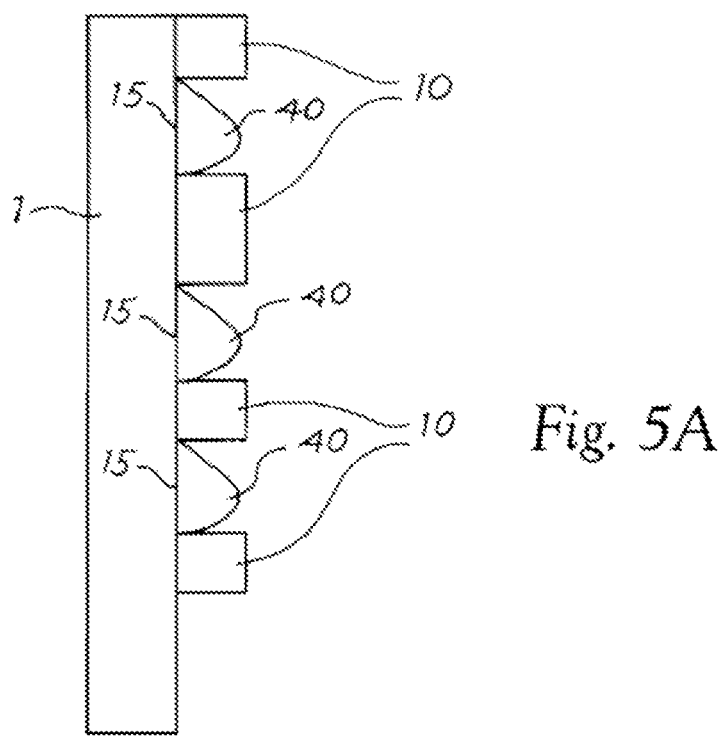

In yet another example, the superhydrophobic features are used to control the instability of the receding line of the evaporating solvent in a roll-to-roll production of micro- and nano-size networks on a substrate. Referring to FIG. 5, two substrates 1 with superhydrophobic features 10 are placed in a substantially vertical position. The superhydrophobic features 10 are preferably patterned. Although the superhydrophobic features 10 as illustrated have a rectangle shape, they can assume any cross-sectional shape, such as squares, rectangles, triangles, and circles. The two substrates 1 are pulled upwardly by a plurality of rollers 45. The substrates 1 are disposed such that they are initially close to each other at a lower end of the apparatus and then are separate from each other at an upper end. A solution 40 containing nanomaterials can be added to the space formed by the two substrates between the lower and upper ends.

Figure 6A:
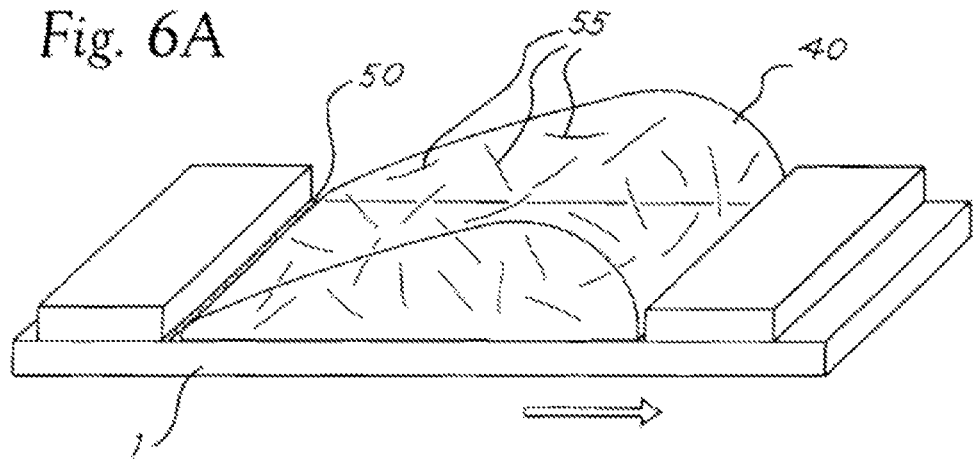
FIG. 6 is an illustration of the interface between the nanomaterial solution and the superhydrophobic surface according to the embodiment of the present disclosure as shown in FIG. 5.
Figure 6B:
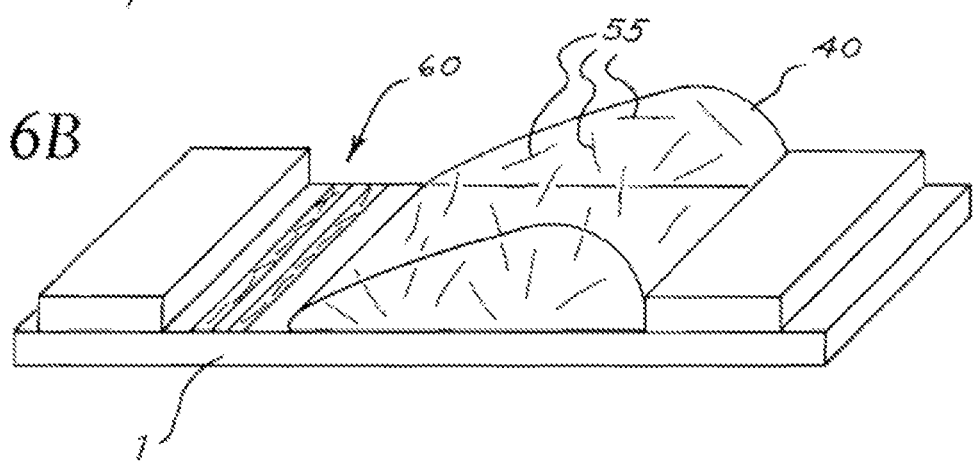
Figure 6C:
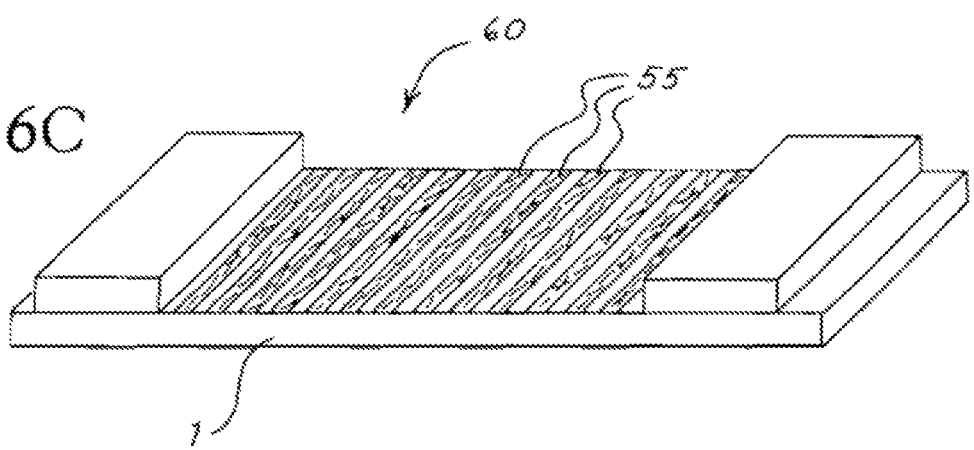

Referring to FIGS. 5 and 6, often time air is trapped between the superhydrophobic features 10 and the solution 40 at the lower end. When the substrates 1 are pulled up and no longer in contact with the solution 40, solution 40 containing nanomaterials recedes to the interfacial area 15. If the interfacial area 15 is too small and the solution 40 cannot get in, adjusting the surface tension of the solution, such as using a surfactant, may solve the problem. When the substrates 1 are further pulled up, the solvent in the solution 40 starts to evaporate, creating a receding edge 50 of gas/liquid/solid interface where nanomaterials are being aligned and deposited via evaporative deposition. Since the substrate is disposed in a substantially vertical position, the receding edge 50 starts forming at the upper end of the interfacial area 15. Alignment and deposition of the nanomaterial 55 in solution 40 via evaporative deposition is not continuous, but rather only at the edge of the receding solution 40 due to the receding edge effect, thus creating network line pattern 60 comprising the nanomaterials 55, as shown in FIGS. 6B and 6C. The network lines 60 may be substantially parallel. The distance between the network lines 60 depends on various factors, such as the speed of solvent evaporation (drying speed), the temperature, the solvent and nanomaterials used, the hydrophobicity (wettability) of the substrate surface. For example, the more wettable the substrate surface is, the slower the drying is, and thus creating narrower gaps between the network lines 60. Conversely, the less wettable the substrate surface is, the quicker the drying is, and thus creating wider gaps between the network lines 60. The nanomaterials 55 are preferably conductive. The resultant network line pattern 60 is preferably transparent.

Not wishing to be bound by any theory, evaporative alignment and deposition of nanomaterials depends on the stability of the receding edge of evaporating liquid containing nanomaterials, such as nanoparticles, nanotubes, nanorods. See, for example, Phys. Rev. E, 71, 036313 (2005) and J. Phys. Chem. B, 2010, 114, 5269-5274, the entireties of both of which are hereby incorporated by reference. The method of the present disclosure allows patterning of substantially straight line of controlled width as well as contour and cross section.

Figure 7A:
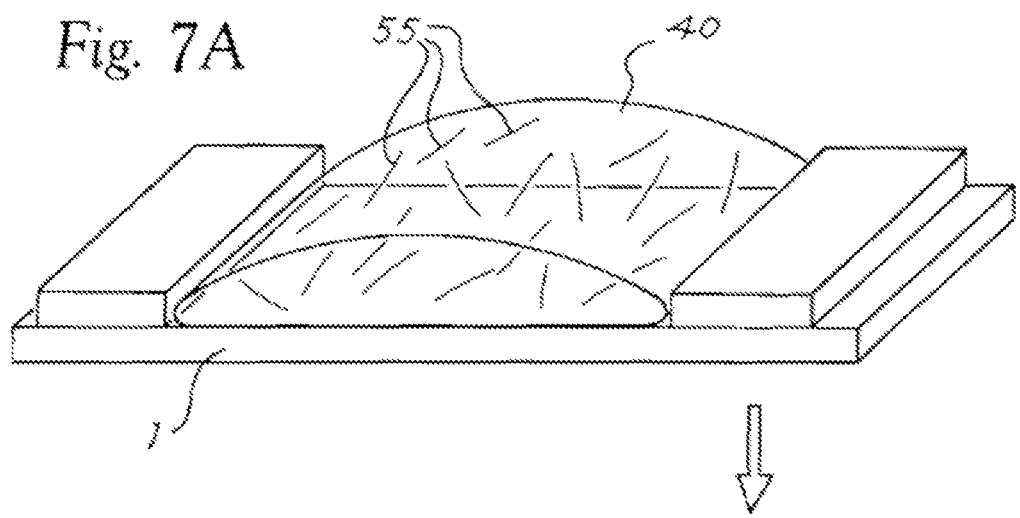
FIG. 7 is an illustration of the interface between the nanomaterial solution and the superhydrophobic surface according to another embodiment of the present disclosure.
Figure 7B:
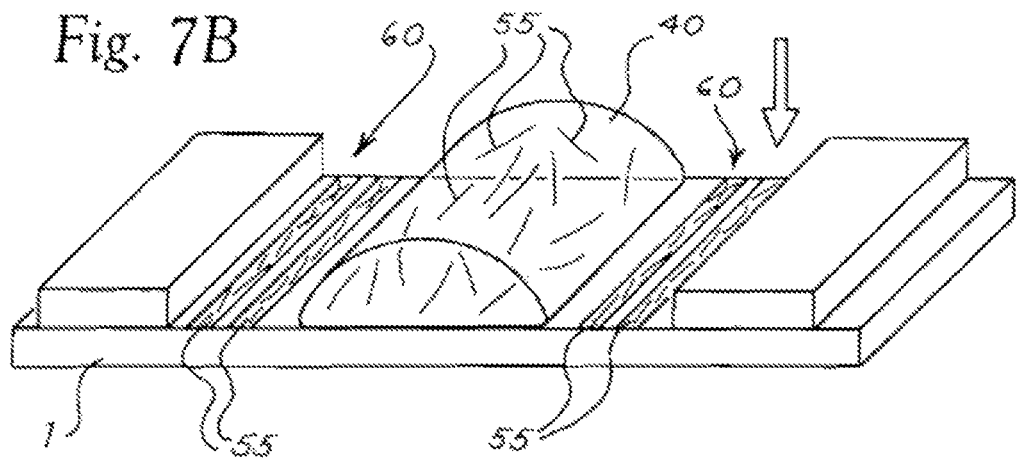
Figure 7C:
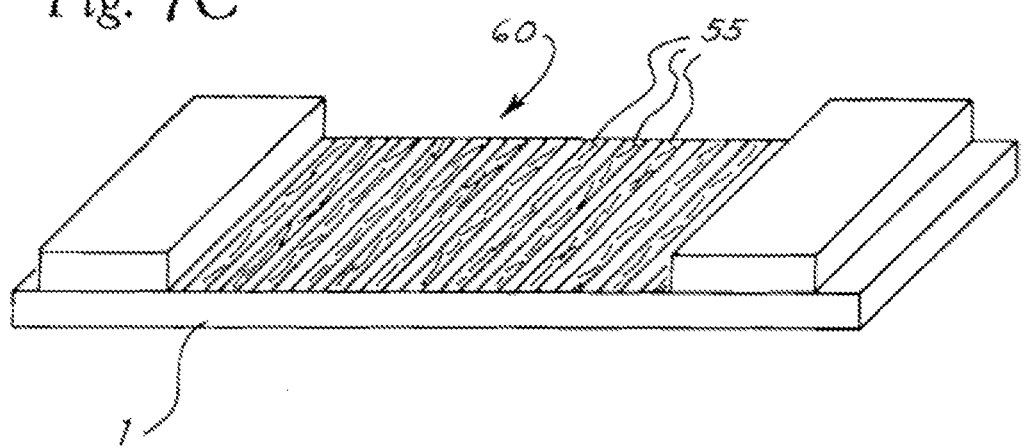

In a further example, referring to FIG. 7, when a substrate 1 is disposed substantially horizontally, a solution 40 with nanomaterials can be deposited to the substrate by any conventional method. When the solvent in the solution 40 evaporates, the solution 40 initially recedes from the superhydrophobic features 10. When the solvent further evaporates, two receding edges 50 of gas/liquid/solid interface are created where nanomaterials 55 are being aligned and deposited via evaporative deposition to form network line pattern 60 comprising the nanomaterials 55, as shown in FIGS. 7B and 7C.

Referring to FIG. 8, sophisticated superhydrophobic feature patterns can be introduced, for example, by etching a superhydrophobic substrate, or printing a superhydrophobic material to a substrate. Following the methods described above, a person having ordinary skill in the art can fabricate various micro- or nano-size networks corresponding to the superhydrophobic feature pattern, preferably conductive and preferably transparent, by depositing nanomaterial solution to the substrate with the superhydrophobic feature pattern and allowing the nanomaterials to self-assemble upon drying up the solvent in the solution. This approach can be used to introduce sophisticated patterns to conductive networks while avoiding the use of any photoresist, which requires an etching step. Also, patterns introduced by photoresists are relatively small. The networks made according to the present disclosure can be in a larger scale, suitable for applications such as large LCD devices.

Carbon nanotubes can be used as conductive nanomaterials according to the method of the present disclosure to form transparent conducting networks. Due to their high aspect ratio, strength, and electronic properties, carbon nanotubes can be used as transistors, as light emitting diodes, and as solar cells. The transparent conductive networks of carbon nanotubes prepared according to the method of the present disclosure have high transparencies, can be flexible, and can be deposited at room temperature on a wide variety of substrates.

A critical concentration of particulate nanomaterials, such as nanoparticles, nanotubes, nanowires, and nanorods, is needed to establish percolation (conductivity) for the conductive network prepared according to the method of the present disclosure. Percolation threshold is the minimum concentration of conducting nanomaterials required to create a conductive network, that is, a minimum concentration of conducting nanomaterials needed to assemble a conductive path through the unit of a composite.

A percolative network is a distribution of objects in which no continuous path forms between objects until a certain critical density is reached. If the network is a series of conductive objects (e.g., conductive particles, wires, rods, etc.), below this threshold the network will not be conductive, while above it, the network will be. The particular case of high aspect ratio conductive objects is discussed in detail here. A thin film of carbon nanotubes, such as the network prepared according to the method of the present disclosure, can be viewed as a two-dimensional percolative network of "conducting rods." When nanotubes are deposited onto a substrate, at first not enough tubes will be present to make the network continuous. That is, the network will have infinite resistance on a macroscopic scale. When nanotubes continue to be added, a critical loading will be reached, and the now continuous network will be conductive, as shown in FIG. 9. This is the percolation threshold. As more tubes are added, the conductivity continues to increase, along with the density of tubes in the network.

Charge transport in polymer-embedded nanotube networks has been studied extensively, and models for percolation in these nanotube polymer networks have been proposed. Even at nanotube densities below percolation, the polymer matrix may still provide a current carrying capacity. Networks of only nanotubes differ in this regard, as there is no medium to transport charge once the nanotube density falls below the percolation threshold. Different methods are therefore necessary to experimentally determine percolation in these networks, since large-scale electrical properties cannot be studied below percolation threshold.

Due to a 1/3:2/3 metallic:semiconducting ratio of single wall carbon nanotubes, metallic tubes are expected to form a continuous network after the overall formation of the nanotube network. This is thought to be of importance, as the junctions between metallic tubes have better transport properties than junctions involving semiconducting tubes. A rise in conductivity would be expected once a continuous network of metallic tubes is formed. This metallic threshold has been determined to exist at around 80% T (where T is transmittance). However, continuous networks below the metallic threshold may be desirable for some applications. Therefore, a study of the "real" percolation threshold of a nanotube network is warranted. Of particular interest is inclusion of the semiconducting nanotubes at appropriate doping levels because the percolation threshold for semiconducting nanotubes is expected to be at transmittances >80 percent.

The onset of percolation in a network is dependent on the aspect ratio of the objects which comprise the network. If each carbon nanotube is idealized as a rod of length $2a$ and diameter $2b$, then the percolation threshold is $p_c \propto b/a$. Thus, the greater the aspect ratio, the lower the threshold.

As it is of interest to understand the role that junctions between bundles play in the networks in addition to the role of the SWNT bundles themselves, it is important to know how the number of intersections scales with the number of carbon nanotubes. Assuming all carbon nanotubes are idealized as rods as described above and that they are randomly oriented with respect to one another, and have a soft-core interaction, the average number of intersections per nanotube, N, is linearly proportional to the number of nanotubes, p: $N=(4/\pi)(a/b)p$. The percolation threshold, $p_c$, therefore corresponds to a critical number of intersections (or points of contact between adjacent nanotubes), $N_c$, where a continuous network forms on a large scale, $p_c=(\pi/4)(b/a)N_c$. The value of $N_c$ is invariant, independent of aspect ratio, and has been found to be about 3.64 or one, depending on the author. The value is not invariant, however, when the size of the objects is widely distributed. The total number of intersections in the network, $N_{tot}$, is quadratically dependent on the total number of nanotubes, and by algebra can be determined simply to be $N_{tot}=(4/\pi)(a/b)p^2$.

A percolation network can be generally described as an array of sites, a lattice, where sites are either occupied or unoccupied. If two occupied sites are adjacent to one another, they are said to be connected, bound to one another. In the case of our idealized nanotube rods, a point where a nanotube exists can be considered to be an occupied site, and the intersection of two nanotubes can be considered to be bound sites. A network below the percolation threshold is composed of isolated bundles of nanotubes, and as $p_c$ is approached, the bundles become interconnected until a continuous network of conductive nanotubes is formed. Eventually, far enough above $p_c$, there are no isolated bundles, and all of the nanotubes are connected. The strength of this network, that is, the probability that a given site belongs to the theoretically infinite network, scales in the form $P \propto (p-p_c)^\beta$. Note that this scaling law is independent of the lattice; the shape and size of the objects and the number of dimensions occupied changes only the values of $p_c$ and $\beta$, with the law retaining the same form.

Considering carbon nanotubes as rigid rods and applying the definition of percolation threshold for the 2D case in anisotropic systems it is possible to calculate the percolation threshold concentration of carbon nanotubes using an excluded volume concept:

For a percolation threshold concentration of SWNT ($q_p$)

$$q_p = \frac{N_c}{V_p} \approx \frac{1}{V_{ex}} \quad (1)$$

where $N_c$ is the number of rods at percolation and $V_p$ is the volume of the cube in which percolation problem is considered (in the case of a composite it is the composite volume), and $V_{ex}$ is the excluded volume, which could be expressed in terms of nanotube dimensions.

$$V_{ex}(d,l) = 2 \cdot d \cdot \left( \frac{2 \cdot \pi}{3} \cdot d^2 + \pi \cdot d \cdot l + l^2 \cdot \langle \sin\gamma \rangle \right) \quad (2)$$

where $d$ and $l$ are the diameter and the length of an elementary unit of the conducting network: a single nanotube (or nanotube bundle), $\gamma$ is the angle between possible orientation of two elementary conducting units of the network (for the isotropic case $\langle \sin\gamma \rangle = \pi/4$)

The percolation threshold was calculated for three diameters of conducting units (rods) 1 nm, 2 nm and 10 nm and increasing length of the unit from 1 nm to $10^5$ nm. Referring to FIG. 13, there are two distinct areas in the graph, one where the percolation threshold depends on both the diameter and length of conducting rods (for L<100 r) and another where the percolation threshold depends only on the diameter (for L>100 r).

For laser-synthesized nanotubes, this critical point can be estimated for two instances: 1) dispersed SWNT d=1.2-1.6 nm, r=0.6-0.7 nm, L=100, r=600-700 nm; 2) SWNT bundles d=20 nm, r=10 nm, L=1000 nm=1 μm. For HIPCO SWNT characterized by large amount of catalyst, the values are d=0.8-1.2 nm, L<1 μm, and for Ressasco's SWNTs grown using MoCo catalyst technology, d=0.4-1.4 nm, L<1 μm.

Laser SWNTs are larger diameter, less defective, longer, and their diameter and length (aspect ratio) can be controlled by the nature of catalyst and processing conditions. Parameters of laser SWNTs are close to those produced by electrical arc process (arc-tubes), but the laser tubes are generally of higher quality (high ratio).

Of particular interest are double wall nanotubes (especially with d>1.4 nm, see aspect ratio considerations) including an inner and outer wall; such nanotubes can sacrifice the outer wall to enable better dispersion in solution while providing nearly defect free electrical conductivity through the inner wall. The double wall carbon nanotubes are expected to perform better than single wall carbon nanotubes in combination with conductive nanoparticles due to a drastically reduced number of side wall defects on the inner walls of the nanotubes.

Figure 10A:
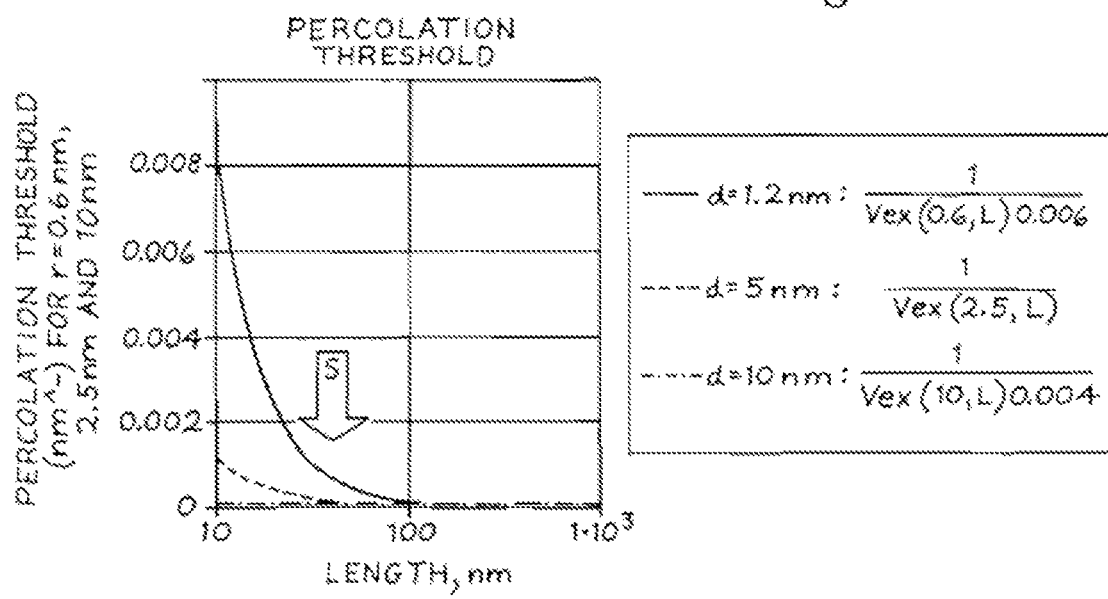
FIG. 10 is an illustration of percolation clustering in preparation of the large area controlled assembly of transparent conductive networks according to another embodiment of the present disclosure.
Figure 10B:
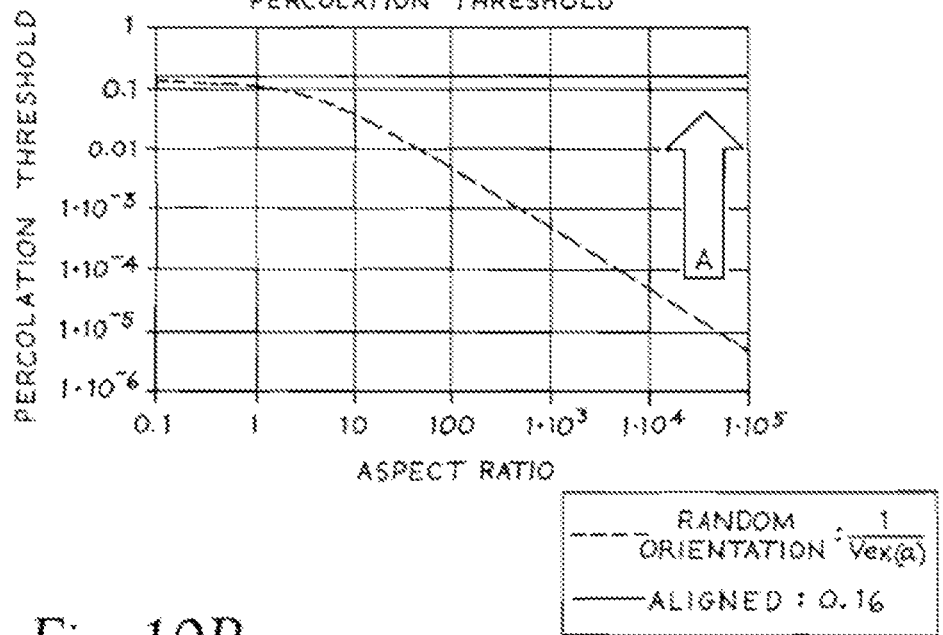

FIG. 10A clearly indicates an advantage of large diameter conducting rods (for example, double wall carbon nanotubes) as they have a lower percolation threshold, especially if networks are built from shorter rods with L<100 r. These conditions may be written in terms of an aspect ratio of the rods: a=L/d<50, where the aspect ratio is defined as the ratio of the length of a rod to its diameter: a=L/d The dependence of percolation threshold on the aspect ratio a of the conducting rods is shown in FIG. 10B for two extreme cases of completely aligned and randomly oriented conducting rods. It can be concluded that the percolation threshold is expected to be much lower for the random orientation than for completely aligned rods. FIGS. 10A and B indicate that use of longer conducting rods (e.g., carbon nanotubes) is beneficial for the design of a composite with a minimal amount of conducting rods.

Referring again to FIG. 9A, in a percolating branched network of nanomaterials, the various clusters of the nanomaterials within the network, which are assembled between electrodes, are differentiated into essential and non-essential clusters. The essential clusters 70 contribute to the percolation. The non-essential clusters 80 do not contribute to the percolation. There may also be empty clusters 90 in the pattern. The empty clusters contains no conductive nanomaterials and thus also do not contribute to percolation.

Figure 9A:
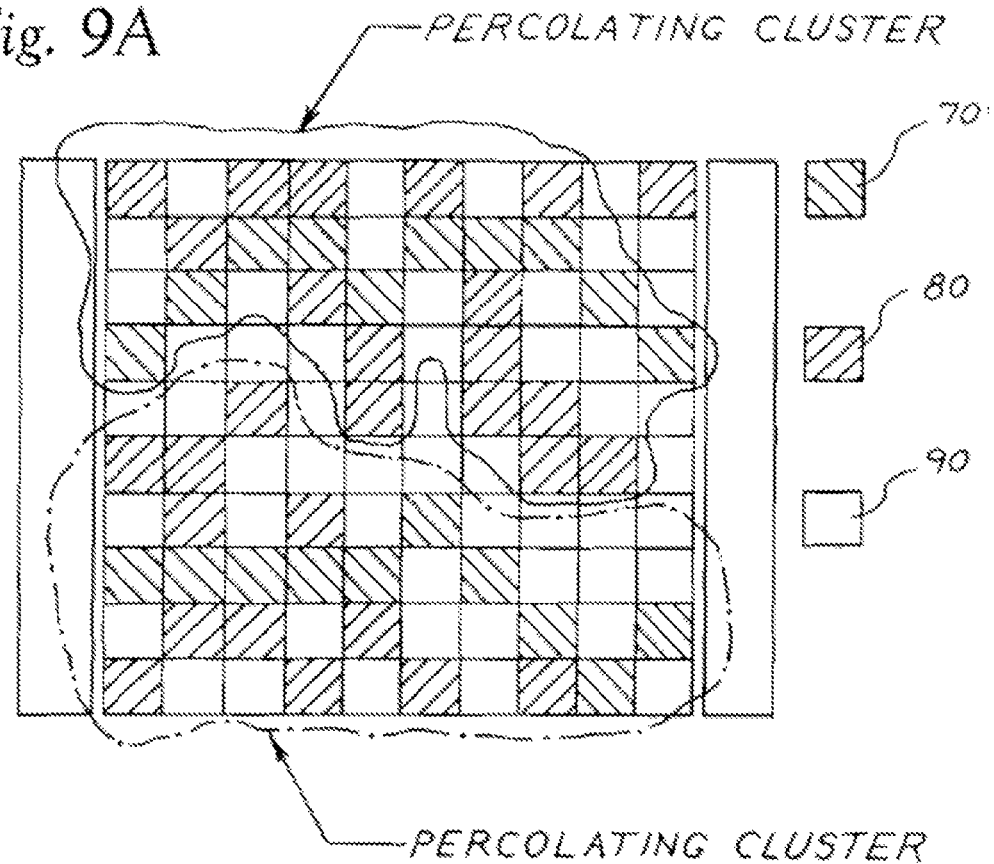
FIG. 9 is an illustration of percolation clustering in preparation of the large area controlled assembly of transparent conductive networks according to one embodiment of the present disclosure.
Figure 9B:
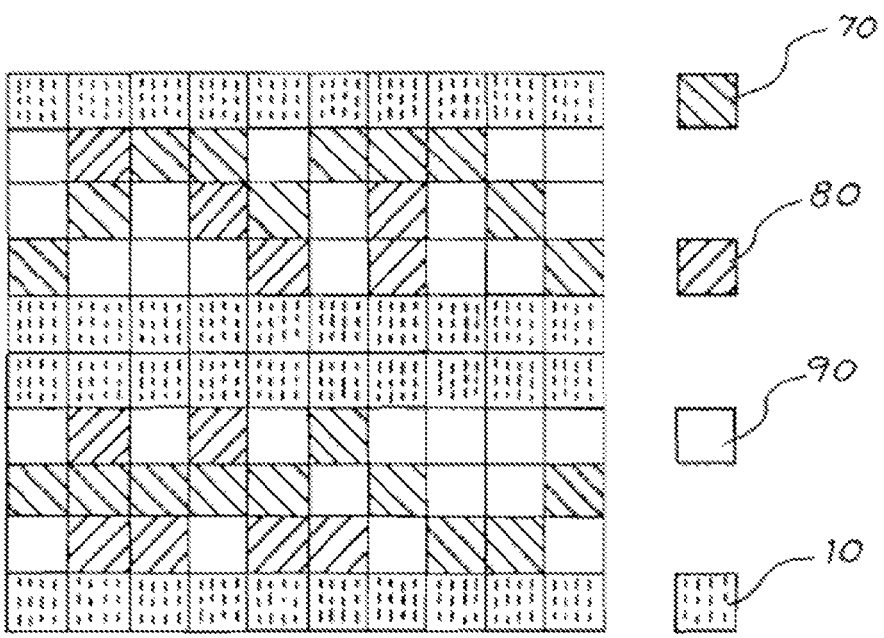

Referring to FIG. 9B, in a percolating branched, patterned network of nanomaterials prepared according to the method of the present disclosure, there are superhydrophobic features 10, such as superhydrophobic nanopatterned lines, where no clusters are disposed. The essential clusters 70, non-essential clusters 80, and empty clusters 90 are disposed on the remaining non-superhydrophobic areas. As such, the amount of nanomaterial used is reduced. Further the alignment of the conductive nanomaterials is improved (discussed infra). In one example, when the same conduction is achieved, the conductive device using the design as shown in FIG. 9A had a transmittance of 52% while the conductive device using the design as shown in FIG. 9B had an improved transmittance (by about 19%) and saved about 19% of the conductive nanomaterials.

Alignment of the conductive nanomaterials reduces the percolation threshold and the number of nanomaterials needed to achieve the same conductivity compared to non-aligned nanomaterials. The alignment of nanomaterials is achieved by orientation of the nanomaterials along the receding edges of the solution disposed on the substrate with the superhydrophobic features. The alignment of high aspect conductive nanomaterials thus assures that a minimum amount of expensive nanomaterial is needed to establish a conductive network. In other words, the conductive networks of the present disclosure produce the same relative conductivity at smaller amount of the conductive nanomaterials (that is, higher transparency). Thus, alignment allows both minimization of nanomaterial (nanoparticles, nanowires, nanorods, nanotubes) in conductive networks and maximization of transmittance through patterns on transparent substrates, such as, glass, quarts, polymer (polyethylene—PET) and others, by minimizing light absorbance and reflectance on the pattern. A computer modeling as shown in FIG. 11 shows the effect of nanotube alignment on the percolation between the source and drain electrodes. The use of nanomaterials in transparent conductive networks and to create superhydrophobic patterns and to enable optimal alignment of conductive nanostructures into straight/arbitrary shaped conductive lines (evaporative patterning) is achieved by the method of the present disclosure.

Nanomaterials need to meet the percolation threshold in order to form a conductive network. High aspect ratio materials, such as nanorods, nanowires and nanotubes, enable a lower percolation threshold compared to nanoparticles. Nanoparticle-based conductive networks can percolate at concentrations of particles >1% or higher (usually around 10%) by weight. Meanwhile, conductive networks made of high aspect ratio nanomaterials percolate at concentrations <1% (usually 0.1%) by weight. However, alignment may also result in highly anisotropic (directional) character of conductivity, with higher conductivity in the direction of the alignment. A particular application of transparent conductive coating will define maximum allowable anisotropy of conductivity.

Many currently available transparent conductive networks have a resistance of greater than 10 Ω/sq with 70% or more transmittance at 550 nm. The transparent conductive networks provided in the present disclosure may have a resistance of less than about 10 Ω/sq with 70% or more transmittance at 550 nm. In one example, the present disclosure provides patterned assembly of particulate nanomaterials into a network that has a resistance of less than about 1 Ω/sq with 70% or more transmittance at 550 nm. Such transparent conductive networks may be used in electronics applications, such as touch screen monitor, flat panel display, and OLED devices.

The transparent conductive networks provided in the present disclosure may be used instead of conventional vacuum deposited indium tin oxide (ITO). These transparent conductive networks may be more conductive and less migratory than ITO devices.

Many illustrative examples of the present disclosure involve transparent conductive networks. However, the scope of the present disclosure is not limited thereto. For example, the method provided in the present disclosure may be used to prepare micro- and nano-networks of semiconducting or magnetic particles, nanotubes, DNA, proteins, and polymer molecules, just to name a few. Thus, while the present disclosure has been described with reference to certain embodiments, other features may be included without departing from the spirit and scope of the present invention. It is therefore intended that the foregoing detailed description be regarded as illustrative rather than limiting, and that it be understood that it is the following claims, including all equivalents, that are intended to define the spirit and scope of this invention.

The invention claimed is:

1. A device comprising:
   a plurality of superhydrophobic features and interfacial areas between the superhydrophobic features, the plurality of superhydrophobic features having a water contact angle of at least about 150°; and
   a conductive network of particulate nanomaterials disposed on the interfacial areas and divided by the superhydrophobic features, the conductive network comprising a plurality of conductive lines of the particulate nanomaterials formed in a single individual interfacial area between two adjacent superhydrophobic features.

2. The device of claim 1, wherein the network is transparent.

3. The device of claim 1, wherein the particulate nanomaterials comprise a metal selected from the group consisting of gold, silver, zinc, titanium, and combinations thereof, or the respective oxide.

4. The device of claim 1, wherein the particulate nanomaterials comprise nanotubes, nanowires, or nanorods.

5. The device of claim 1, wherein the particulate nanomaterials have an aspect ratio of between about 1 and 2,500.

6. The device of claim 1, wherein the particulate nanomaterials in the plurality of conductive lines are aligned in the single individual interfacial area.

7. The device of claim 1, wherein the plurality of conductive lines of the particulate nanomaterials formed in the single individual interfacial area between two adjacent superhydrophobic features are substantially parallel.

8. The device of claim 1, wherein the concentration of the particulate nanomaterials is sufficient to establish percolation for the conductive network of particulate nanomaterials.

9. A device comprising:
   a drawn substrate, a plurality of superhydrophobic features and interfacial areas between the superhydrophobic features disposed on the drawn substrate; and
   a conductive network of particulate nanomaterials disposed on the interfacial areas and divided by the superhydrophobic features, the conductive network comprising a plurality of aligned conductive lines of the particulate nanomaterials formed in a single individual interfacial area between two adjacent superhydrophobic features.

10. The device of claim 9, wherein the network is transparent.

11. The device of claim 9, wherein the particulate nanomaterials comprise nanotubes, nanowires, or nanorods.

12. The device of claim 9, wherein the particulate nanomaterials have an aspect ratio of less than 50.

13. The device of claim 9, wherein the plurality of aligned conductive lines of the particulate nanomaterials formed in the single individual interfacial area between two adjacent superhydrophobic features are substantially parallel.

14. The device of claim 9, wherein the concentration of the particulate nanomaterials is sufficient to establish percolation for the conductive network of particulate nanomaterials.

* * * * *